US007801399B2

(12) United States Patent
Yamamoto

(10) Patent No.: US 7,801,399 B2
(45) Date of Patent: Sep. 21, 2010

(54) METHOD OF FORMING OPTICAL WAVEGUIDE

(75) Inventor: Kazunao Yamamoto, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/204,140

(22) Filed: Sep. 4, 2008

(65) Prior Publication Data

US 2009/0065132 A1 Mar. 12, 2009

(30) Foreign Application Priority Data

Sep. 5, 2007 (JP) ............................ 2007-230646

(51) Int. Cl.
*G02B 6/036* (2006.01)
*G02B 6/10* (2006.01)
*B32B 37/02* (2006.01)

(52) U.S. Cl. ........................ 385/14; 385/129; 385/130; 385/131; 385/132; 156/247

(58) Field of Classification Search .................. 156/247
See application file for complete search history.

(56) References Cited

U.S. PATENT DOCUMENTS

2008/0031584 A1* 2/2008 Payne ........................ 385/132
2008/0138007 A1* 6/2008 Okubo et al. ................. 385/14

FOREIGN PATENT DOCUMENTS

JP 2000-199827 7/2000
JP 2004-341454 12/2004
JP 2004341454 A * 12/2004

* cited by examiner

*Primary Examiner*—Joseph S Del Sole
*Assistant Examiner*—Vicki Wu
(74) *Attorney, Agent, or Firm*—Drinker Biddle & Reath LLP

(57) ABSTRACT

Parallel-aligned core layers are formed by patterning a core sheet laminated on a base plate, and a clad/core bonded body is formed by laminating a cladding sheet. The base plate is peeled from one surface of the clad/core bonded body and a dicing tape is pasted on the other surface of the clad/core bonded body. An inclined surface is formed by bevel-cutting both end portions of the core layers. Clad/core bonded pieces are formed by straight-cutting the cladding sheet between core layers and on an outside of outermost core layers. A mask is disposed on the clad/core bonded pieces, and then a metal film is formed on the inclined surface. The clad/core bonded pieces are separated individually by peeling the pieces from the dicing tape after the mask is removed. The clad/core bonded piece is brought into contact with the liquid adhesive coated on a circuit substrate and aligned thereon. Then, the liquid adhesive is cured.

2 Claims, 9 Drawing Sheets

METHOD OF FORMING OPTICAL WAVEGUIDE

This application is based on and claims priority from Japanese Patent Application No. 2007-230646, filed on Sep. 5, 2007, the entire contents of which are hereby incorporated by reference.

BACKGROUND OF THE INVENTION

1. Technical Field

The present disclosure relates to a method of forming an optical waveguide on a circuit substrate.

2. Related Art

In various electronic circuits, with enhancement of a signal carrying speed (increase of a higher frequency), optical/electrical hybrid circuits a part of which is replaced with optical interconnection using the optical waveguide in place of the conductive wirings made of copper has been developed.

In FIGS. 1A and 1B, a typical example of an optical waveguide mounted on a circuit substrate is shown. As shown in FIG. 1A, both surfaces of a core layer 12 serving as a light traveling path of an optical waveguide 10 are covered with a lower cladding layer 14*a* and an upper cladding layer 14*b*, and the optical waveguide 10 has a light polarizing plate 16 on an inclined surface of the end portion. As shown in FIG. 1B, the optical waveguide 10 is mounted on a circuit substrate 20 by an adhesive 18. For example, the circuit substrate 20 is constructed by forming an insulating layer 26 and a wiring layer 28 as a build-up layer on both surfaces of a double-sided copper-clad core substrate up to a predetermined number of layers. According to the double-sided copper-clad core substrate, a copper foil 24 is pasted onto both surfaces of a core material 22. Then, a solder land 30 and a solder resist layer 32 used for the external connection are formed on the upper surface. The optical waveguide 10 is adhered onto the uppermost insulating layer 26 by the adhesive 18, for example.

As disclosed in JP-A-2000-199827, for example, in the known method of forming the optical waveguide, a triple-layered structure consisting of lower cladding layer/core layer/upper cladding layer is formed by three steps of laminating and curing a lower cladding sheet, laminating and patterning a core sheet, and laminating and curing an upper cladding sheet, and then this triple-layered structure is bonded to the circuit substrate with the adhesive.

According to the above method, much takt time and cost are required for the above three steps, and also the upper/lower cladding layers formed by laminating the cladding sheet have a certain thickness respectively. Therefore, the above method has such a disadvantage that this method is unsuitable for the slimming down of the circuit.

Meanwhile, as described in JP-A-2004-341454, an upper cladding layer and a core layer are sequentially laminated on a metal layer for wiring layer formation, then a cover film for protection is pasted on the core layer, and then a V-groove is formed on the core layer by applying the cutting process. The unnecessary core layer of the optical waveguide in one side of the V-groove is melted and removed while the core layer on the other side of the V-groove remains as the core layer of the optical waveguide, so that a laminated product is formed. This laminated product has a double-layered structure such that the upper cladding layer and the core layer are laminated on the metal layer for forming the wiring layer. Then, the core layer side the laminated product is adhered onto the circuit substrate via the adhesive. Accordingly, the optical waveguide consisting of upper cladding layer (laminated layer)/core layer (laminated layer)/lower cladding layer (adhesive layer) is formed on the circuit substrate. The electric circuit may be provided on the upper surface of the circuit substrate to which the laminated product is adhered.

However, the method described in JP-A-2004-341454 has the following disadvantages.

Namely, the substrate on which the upper cladding layer and the core layer are formed always requires the metal layer for forming the wiring layer, and thus the laminated product is restricted to such a structure that a predetermined wiring layer is provided directly on the upper cladding layer of the completed optical waveguide. Therefore, the laminated product must be designed integrally with the circuits on the circuit substrate. This leads to lack of versatility. Alternately, although not described in JP-A-2004-341454, even though the laminated product is used after the metal layer is removed, the wet process is required to melt/remove the metal layer and thus steps become complicated.

Also, a bottom portion of the V-groove on the core layer formed by the cutting process must match up with a boundary between the upper cladding layer and the core layer. Thus, processing accuracy is required in forming the V-groove.

SUMMARY OF TH INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a method of forming an optical waveguide, capable of reducing a takt time and a cost required for formation of a triple-layered structure, slimming down a circuit structure, and enhancing versatility without need of complicated processes.

According to one or more aspects of the present invention, there is provided a method of forming an optical waveguide on a circuit substrate. The method includes:

(a) laminating a core sheet on a base plate;

(b) patterning the core sheet, thereby forming a plurality of core layers each aligned in parallel on the base plate;

(c) laminating a cladding sheet on the base plate such that the core layers are embedded in the cladding sheet except one surface of each of the core layers contacting the base plate, thereby forming a clad/core bonded body;

(d) peeling the base plate from the clad/core bonded body;

(e) pasting a dicing tape on one surface of the clad/core bonded body opposite to said one surface of each of the core layers exposed from the cladding sheet;

(f) bevel-cutting the core layers and the cladding sheet in a width direction of the core layers on both side portions of the core layers, thereby forming an inclined surface in the clad/core bonded body;

(g) straight-cutting the cladding sheet between the core layers and on an outside of outermost core layers of the core layers along a length direction of the core layers, thereby collectively forming a plurality of clad/core bonded pieces;

(h) disposing a mask on the clad/core bonded pieces such that the inclined surface of the clad/core bonded pieces is exposed from the mask;

(i) forming a metal film on the inclined surface, wherein the metal mask serves as a reflecting film;

(j) removing the mask;

(k) peeling the dicing tape from the clad/core bonded pieces, thereby separating the clad/core bonded pieces individually;

(l) coating a liquid adhesive having a composition that is able to constitute a cladding layer of the optical waveguide, on an area of the circuit substrate on which the optical waveguide is to be arranged;

(m) bringing at least one of the clad/core bonded pieces into contact with the liquid adhesive such that said one surface of the core layer exposed from the cladding sheet contacts the liquid adhesive;

(n) aligning the at least one of the clad/core bonded pieces on the area of the circuit substrate on which the optical waveguide is to be arranged; and (o) curing the liquid adhesive, thereby forming the optical waveguide on the circuit substrate, wherein the optical waveguide comprises: a lower cladding layer formed of the cured adhesive; the core layer of the clad/core bonded piece; and a upper cladding layer formed of the cladding sheet.

The clad/core bonded pieces having a double-layered structure are formed on the dicing tape. Therefore, takt time and cost required for forming the triple-layered structure can be reduced, and high versatility can be assured without imposing restrictions on design, which are indispensable in forming the double-layered structure on the metal layer used for forming the wiring layer, and without needing the complicated wet process, which is applied to remove the metal layer. Also, processing accuracy is not required since the bevel cutting applied in forming the inclined surface can be applied to reach the dicing tape, and the liquid adhesive adhered onto the circuit substrate can be employed as the lower cladding layer. Therefore, the slimming down can be attained more easily than the formation of the optical waveguide by laminating the sheet, and a positional accuracy of the clad/core bonded piece can be enhanced.

Furthermore, the core layer contains a plurality of sub-core layers, and the same material as the cladding layer is filled between the sub-core layers. Therefore, a plurality of optical waveguides can be formed collectively by a single clad/core bonded piece.

Other aspects and advantages of the present invention will be apparent from the following description, the drawings, and the claims.

DETAILED DESCRIPTION OF EXEMPLARY EMBODIMENTS OF THE PRESENT INVENTION

Exemplary embodiments of the present invention will be described with reference to the drawings, hereinafter.

Embodiment 1

Embodiments in which an optical waveguide is formed according to the present invention will be described with reference to FIG. 2 to FIG. 6 hereinafter.

Step 1

Figure 1A:
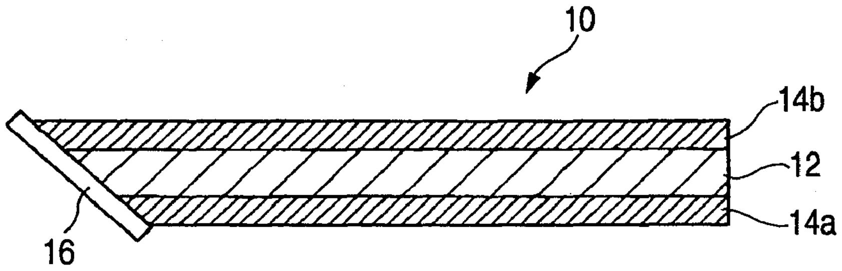
FIG. 1A is a sectional view of an optical waveguide in the related art.
Figure 1B:
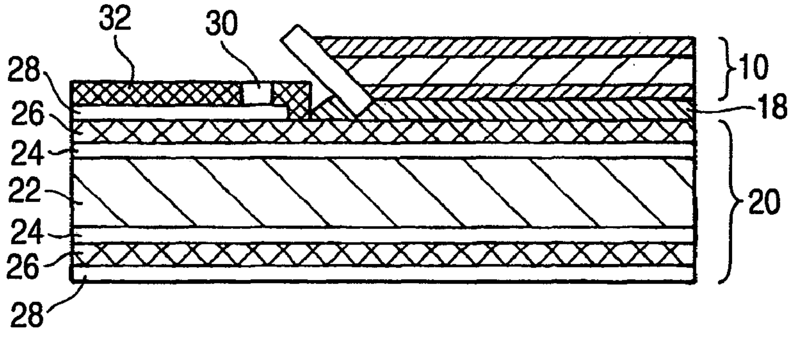
FIG. 1B is a sectional view showing a state that the optical waveguide is mounted on a circuit substrate in the related art.
Figure 2A:
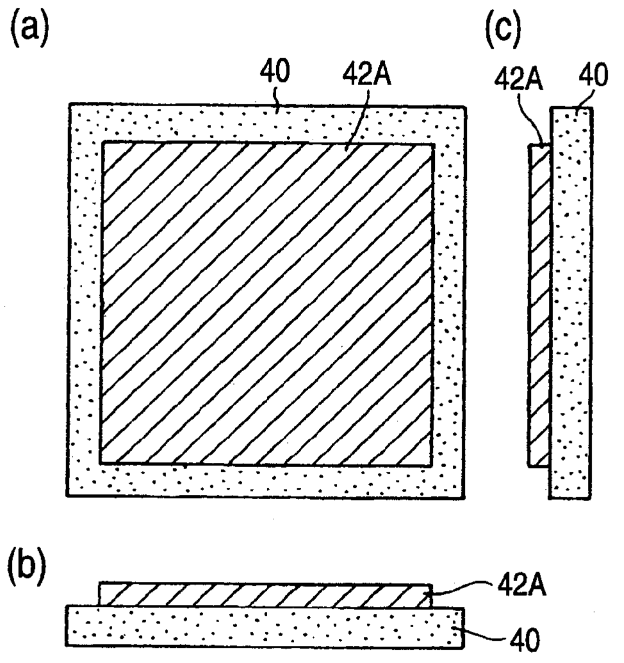
FIG. 2A shows a step of laminating a core sheet on a base plate according to an exemplary embodiment of the present invention, where (a) is a plan view, (b) is a cross sectional view, and (c) is a side view.
Figure 2B:
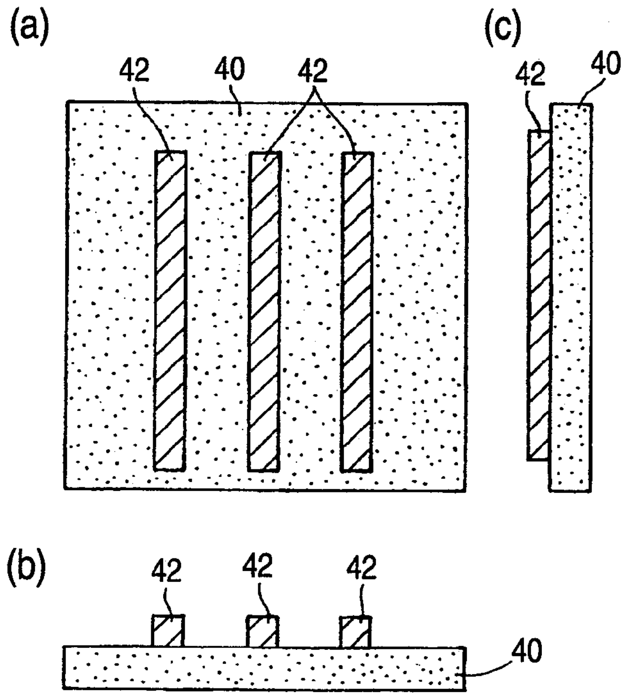
FIG. 2B shows a step of forming a plurality of parallel-aligned core layers by patterning the core sheet laminated on the base plate, according to an exemplary embodiment of the present invention, where (a) is a plan view, (b) is a cross sectional view, and (c) is a side view.

As shown in (a) a plan view, (b) a cross sectional view, and (c) a side view in FIG. 2A, a core sheet 42A is laminated on a base plate 40. As the base plate 40, acrylic, polycarbonate, PET plate may be employed, and the base plate 40 having a high flatness is advantageous. As the core sheet 42A, photo curable acrylic resin, epoxy resin, polyimide resin, fluororesin, electron curable resin may be used. As the resin whose solubility relative to the solvent is enhanced by the irradiation of an activation energy ray, a naphthoquinone resin with a photodecomposition property, or the like can be used. Out of them, the resin having high transparency and high thermal resistance is advantageous.

Step 2

As shown in FIG. 2A, the core sheet 42A is patterned by the exposure/development. Thus, a plurality of core layers 42 aligned in parallel are formed.

Step 3

Figure 3A:
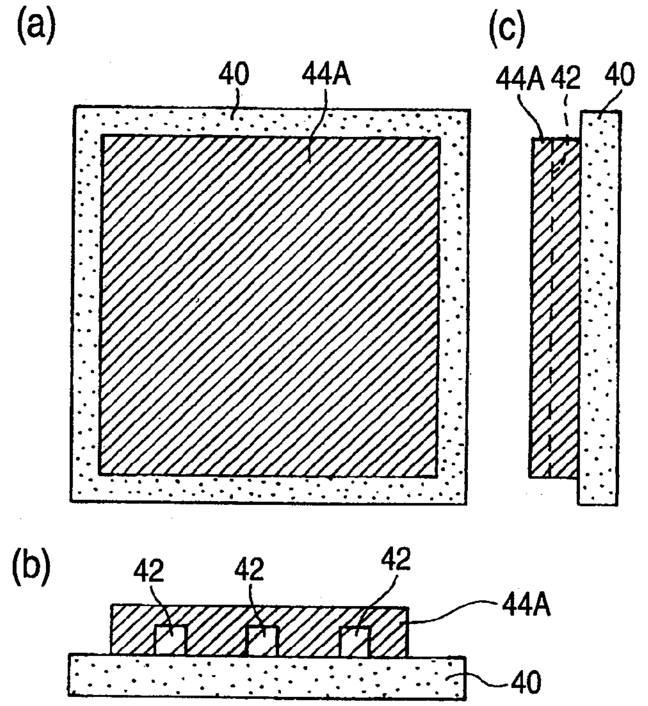
FIG. 3A shows a step of forming a clad/core bonded body by laminating a cladding sheet on the base plate on which a plurality of core layers are formed, according to an exemplary embodiment of the present invention, where (a) is a plan view, (b) is a cross sectional view, and (c) is a side view.

As shown in FIG. 3A, a cladding sheet 44A is laminated on the base plate 40 on which the plurality of core layers 42 are aligned in parallel. Accordingly, the plurality of core layers 42 except contact surfaces to the base plate 40 are embedded in the cladding sheet 44A. That is, the cladding sheet 44A and the core layers 42 are pasted on the base plate 40 to constitute an integrally-bonded body (a clad/core bonded body 42/44A). As the cladding sheet 44A, a thermosetting resin such as epoxy resin, polyimide resin, unsaturated polyester resin, epoxy aclyrate resin may be used, in addition to the photo curable acrylic resin like the core sheet 42A. Also, a flame retardant or an ultraviolet absorbent based on addition-type or reaction-type halogen, phosphorus, silicon, or the like may be contained in this resin to give a flame retardancy or to absorb an activation energy ray.

Step 4

Figure 3B:
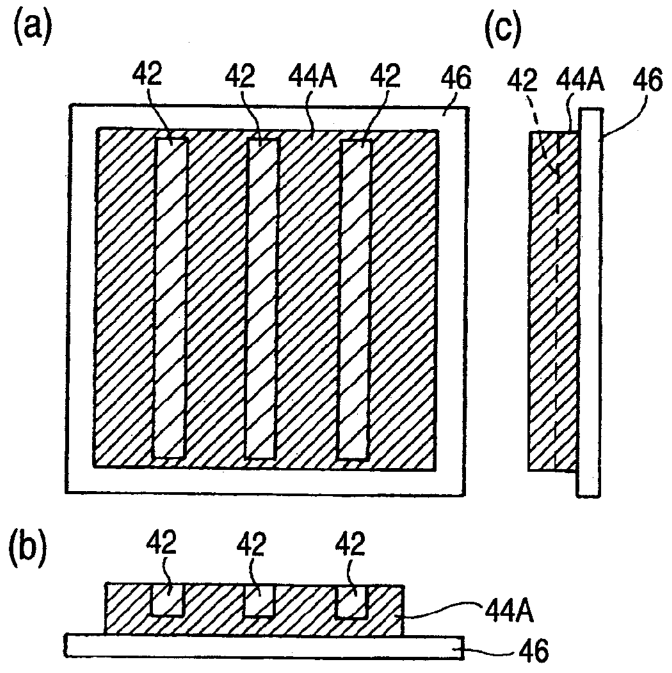
FIG. 3B shows a step of pasting a dicing tape on the clad side of the clad/core bonded body after the base plate is peeled, according to an exemplary embodiment of the present invention, where (a) is a plan view, (b) is a cross sectional view, and (c) is a side view.

The base plate 40 is peeled from the clad/core bonded body 42/44A. Thus, the surfaces of the core layers contacting the base plate 40 are exposed from the cladding sheet 44A of the clad/core bonded body 42/44A. The cladding sheet 44A side of the clad/core bonded body 42/44A is pasted onto a dicing tape 46. This state is shown in FIG. 3B.

Step 5

Figure 4A:
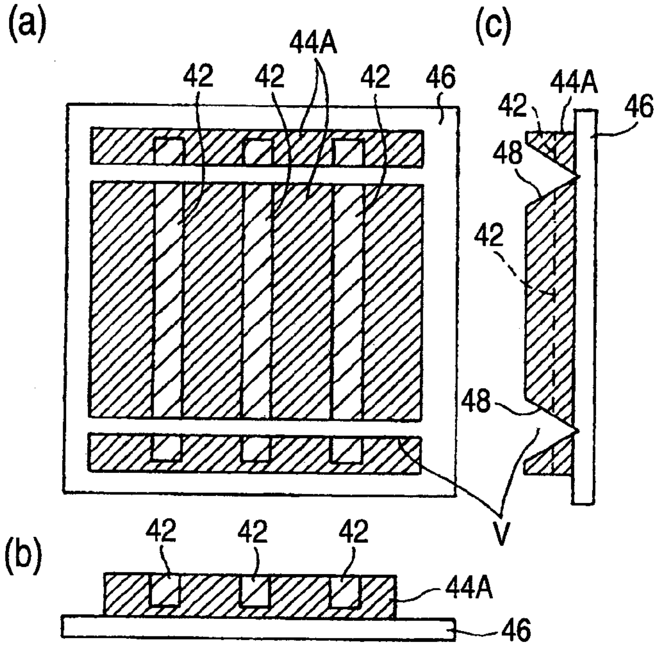
FIG. 4A shows a step of forming an inclined surface by bevel-cutting the core layers and the cladding sheet in the width direction of the core layers on both side portions of the core layers on the dicing tape, according to an exemplary embodiment of the present invention, where (a) is a plan view, (b) is a cross sectional view, and (c) is a side view.

Then, as shown in FIG. 4A, inclined surfaces 48 are formed by bevel-cutting (V) the core layers 42 and the cladding sheet 44A provided to fill the core layers 42, in the width direction of the core layers 42 (the lateral direction on FIG. 4A) on both side portions of the plurality of core layers 42 on the dicing tape 46. A cutting depth of the bevel cutting (V) is set adequately to such an extent that the cutting depth enters slightly into the dicing tape 46 to cut completely the core layers 42 and the cladding sheet 44A. As an advantage of the present invention, a high processing accuracy is not required in executing the bevel cutting.

Step 6

Figure 4B:
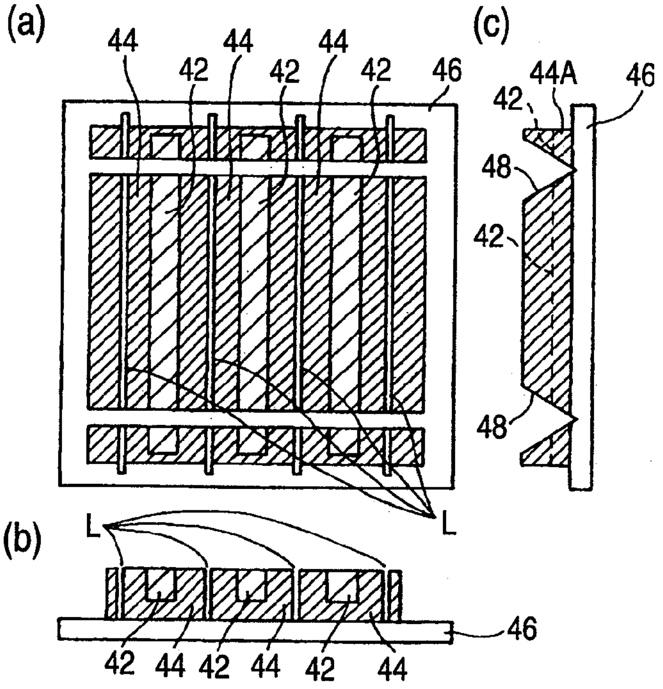
FIG. 4B shows a step of collectively forming a plurality of clad/core bonded pieces by straight-cutting the cladding sheet between the core layers and on the outside of the outermost core layer along a length direction of a plurality of core layers, according to an exemplary embodiment of the present invention, where (a) is a plan view, (b) is a cross sectional view, and (c) is a side view.

Then, as shown in FIG. 4B, the cladding sheet 44A is subjected to straight-cut (L) between the core layers 42 and on the outside of the outermost core layer 42 on the dicing tape 46 along a length direction of the plurality of core layers 42. Thus, a plurality of clad/core bonded pieces 42/44 embedded in the cladding layer 44 are collectively formed in a state that one surfaces of the core layers 42 are exposed.

Step 7

Figure 5A:
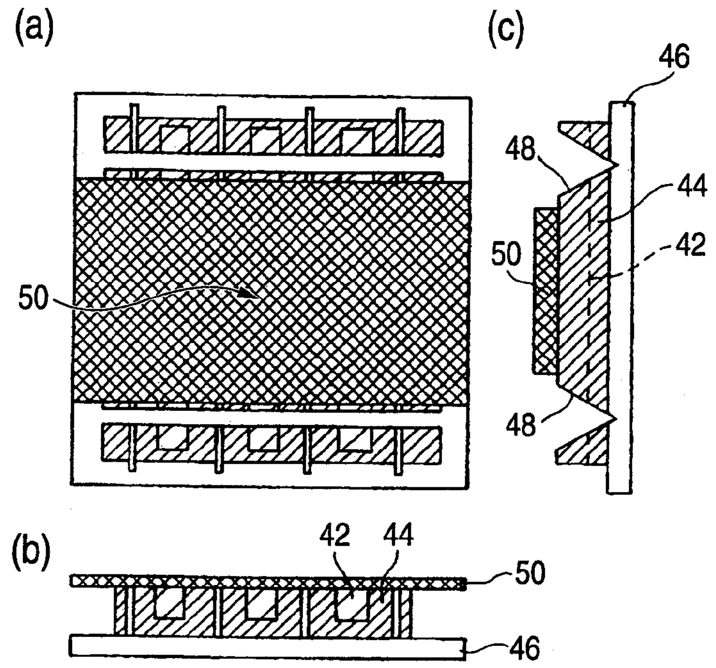
FIG. 5A shows a step of arranging a mask on the clad/core bonded body except the inclined surfaces of the core layers on the dicing tape, according to an exemplary embodiment of the present invention, where (a) is a plan view, (b) is a cross sectional view, and (c) is a side view.

Then, as shown in FIG. 5A, a mask 50 is arranged over the dicing tape 46 such that the cladding layers 44 and the core layers 42 of the plurality of clad/core bonded pieces 42/44 are covered but the inclined surfaces 48 are exposed. As the mask 50, for example, a metal mask made of nickel may be used.

Step 8

Figure 5B:
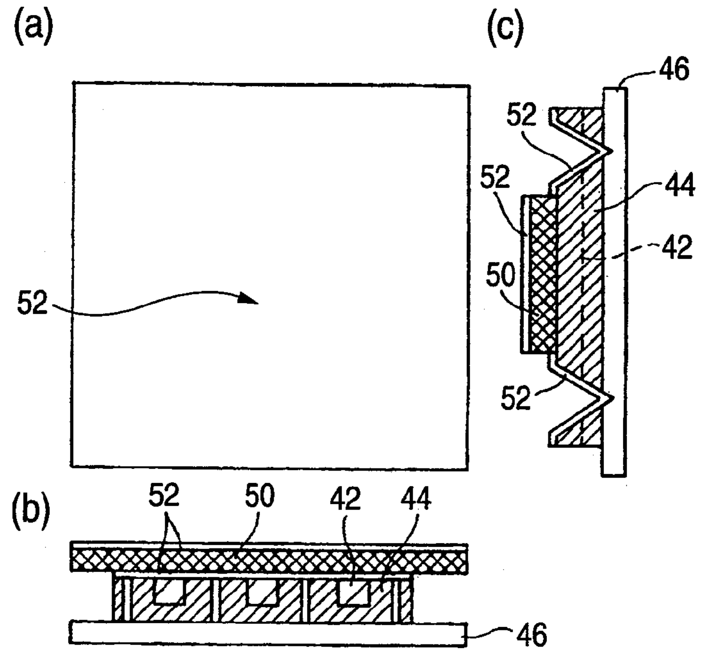
FIG. 5B shows a step of forming a metal film as a reflecting film on the inclined surface of the clad/core bonded body, according to an exemplary embodiment of the present invention, where (a) is a plan view, (b) is a cross sectional view, and (c) is a side view.

Then, as shown in FIG. 5B, a metal film 52 made of gold is formed on the dicing tape 46 by the sputter via the mask 50. Accordingly, the metal film 52 as a reflecting film is formed on the inclined surfaces 48 of the clad/core bonded pieces 42/44 exposed from the mask 50.

Step 9

Figure 6A:
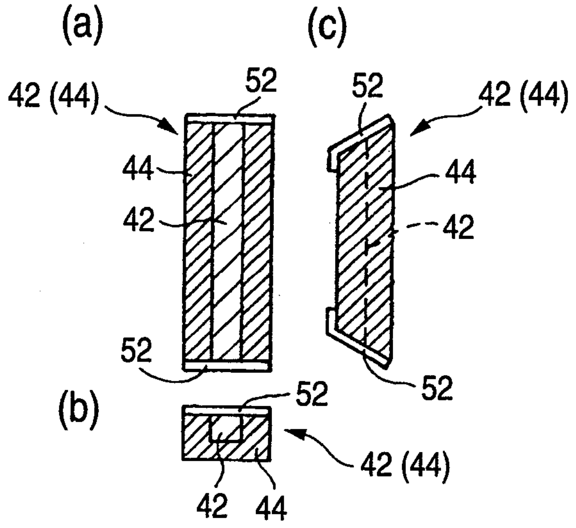
FIG. 6A shows a step of separating the clad/core bonded pieces individually by peeling the clad/core bonded pieces from the dicing tape after the mask is removed, according to an exemplary embodiment of the present invention, where (a) is a plan view, (b) is a cross sectional view, and (c) is a side view.

Then, as shown in FIG. 6A, the clad/core bonded pieces 42/44 are peeled from the dicing tape 46 after the mask 50 is removed. Thus, the clad/core bonded pieces 42/44 are separated individually.

Step 10

Figure 6B:
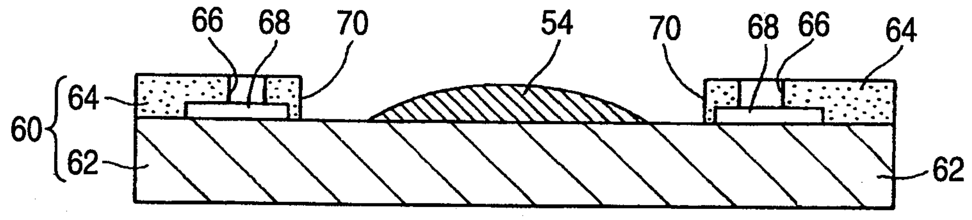
FIG. 6B is a cross-sectional view showing a step of coating a liquid adhesive on optical waveguide aligning portions of the circuit substrate, according to an exemplary embodiment of the present invention.

As shown in FIG. 6B, a liquid adhesive 54 having a composition that can construct the cladding layer of the optical waveguide is coated on optical waveguide aligning portions of a circuit substrate 60. The circuit substrate 60 has connection pads 68, which are exposed from openings 66 in a solder resist layer 64, on the uppermost layer of a multilayer wiring structure 62. In the illustrated example, the liquid adhesive 54 is coated on exposed surfaces of the multilayer wiring structure 62, which are exposed from the large opening 70 in the solder resist layer 64.

As the liquid adhesive 54, any liquid adhesive can be used if a refractive index after the adhesive is cured becomes lower than the core layers 42. It is advantageous that the liquid adhesive 54 should have the same composition as the cladding layer 44.

Step 11

Figure 6C:
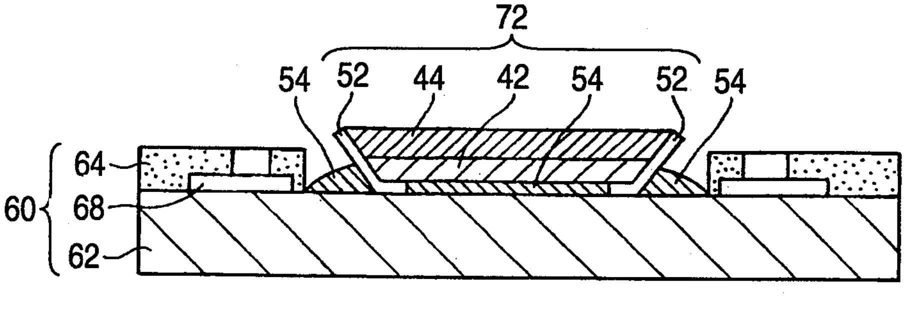
FIG. 6C is a sectional view showing a step of forming the optical waveguide on the circuit substrate by curing the adhesive after the clad/core bonded pieces are brought into contact with the adhesive and aligned.

Then, as shown in FIG. 6C, the exposed surfaces of the core layers 42 of the clad/core bonded pieces 42/44 are brought into contact with the liquid adhesive 54 and then are aligned with the liquid adhesive 54. Then, the liquid adhesive 54 is cured. Accordingly, an optical waveguide 72 consists of the lower cladding layer 54 made of the cured adhesive, the core layer 42 of the clad/core bonded piece 42/44, and the upper cladding layer 44 formed of the cladding layer of the clad/core bonded piece 42/44, and has the reflecting film 52 on both sides respectively, and the optical waveguide 72 is formed on the circuit substrate 60.

As one advantage of the present invention, as described above, the clad/core bonded pieces 42/44 can be aligned such that these pieces are brought into contact with the liquid adhesive 54. As a result, alignment accuracy can be higher than that in the conventional method in which the optical waveguide is formed by press-bonding these pieces to the cladding sheet.

In particular, a height of a top surface (upper surface of the upper cladding layer) of the optical waveguide aligned on the circuit substrate requires a high dimensional accuracy. This is because its positioning to the light emitting element/the light receiving element that are essential to the configuration of the optical wiring is important. As a factor of deciding a height of the optical waveguide, a variation in thickness of the materials of the cladding sheet cannot be excluded in the conventional method using the press-bonding. In contrast, according to the method of the present invention, a height of the top surface can be adjusted in the layer of the liquid adhesive. Therefore, a variation of thickness of the materials can be absorbed.

As described above, according to the present invention, the clad/core bonded pieces having a double-layered structure can be fabricated by simple processing steps that need no complicated process such as the wet process, etc., and can be adhered onto the circuit board by the liquid adhesive. Therefore, a take time and a cost can be reduced as compared with the conventional method in which the triple-layered structure is fabricated by laminating the sheet material. Also, the restrictions of design in the conventional method in which the optical waveguide is formed on the metal layer for forming the wiring layer are not imposed, and a high versatility can be ensured.

Embodiment 2

Figure 7:
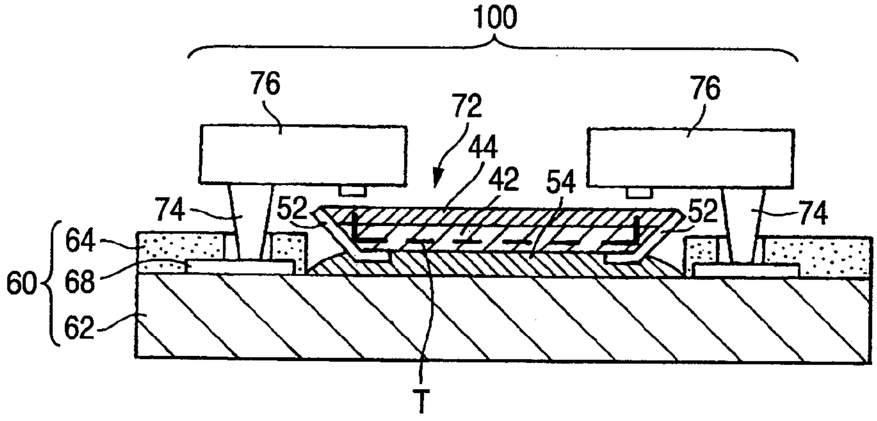
FIG. 7 is a cross-sectional view showing an optical wiring that is assembled on the circuit substrate by using the optical waveguides formed according to the present invention.

FIG. 7 shows an optical wiring 100 that is constructed by forming the optical waveguide 72 on the circuit substrate 60 like FIG. 6C according to the present invention. Light receiving/emitting portions 76, 76 are provided on a pair of connection pads 68, 68 positioned near both ends of the optical waveguide 72 via bumps 74, 74 respectively. The light emitting element such as Vertical Cavity Surface Emitting Laser (VCSEL) and the light receiving element such as the photo diode are built in the light receiving/emitting portions 76, 76 respectively, and the light receiving/emitting portions 76, 76 transmit/receive the light signal. Namely, the light receiving/emitting portions 76, 76 are connected optically by a light signal transmission T passing through the core layer 42 of the optical waveguide 72, thereby constituting the optical wiring 100. An optical/electrical hybrid circuit is constructed by the optical wiring 100 and the electric wirings on the circuit board 60.

Embodiment 3

Figure 8:
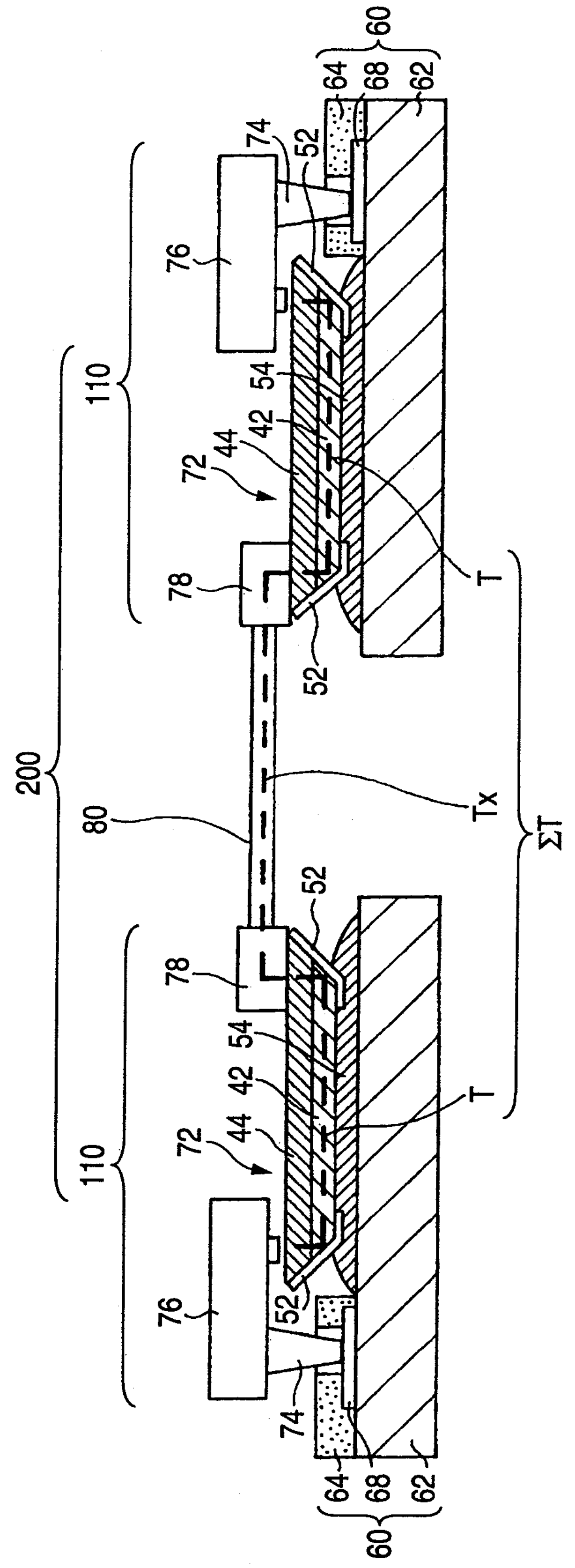
FIG. 8 is a cross-sectional view showing a state that connecting portions between the optical fibers and the electric circuits are constructed by using a pair of optical interconnection assembled on the circuit substrate by using the optical waveguides formed according to the present invention.

FIG. 8 shows the optical/electrical hybrid circuit in which a pair of optical interconnection 110, 110, which are constructed by forming the optical waveguides 72, 72 on two circuit boards 60, 60 shown in FIG. 6C according to the present invention respectively, are remotely connected via an optical fiber 80. In this case, this configuration is partially different from a configuration shown in FIG. 6C. Namely, the light receiving/emitting portion 76 similar to the Embodiment 2 is provided on the connection pads 68 positioned near one end of the optical waveguide 72 on the circuit substrate 60 respectively via the bumps 74. Unlike the Embodiment 2, an optical connector 78 is provided to the other end of the optical waveguide 72 to come into contact with the upper surface of the upper cladding layer 44.

The optical interconnection 110, 110 on two circuit substrates 60, 60 are connected to both ends of the optical fiber 80 by two optical connectors 78, 78 of the optical waveguides 72, 72 respectively. Optical signal transmissions ΣT are constructed by an optical signal transmission T passing through the optical waveguide 72 of one optical wiring 110, an optical signal transmission Tx passing through the optical fiber 80, and an optical signal transmission T passing through the optical waveguide 72 of the other optical wiring 110. The optical signal transmissions ΣT are formed by an optical wiring 200 in which one optical wiring 110, the optical fiber 80, and the other optical wiring 110 are integrally composed mechanically and optically. The optical/electrical hybrid circuit is constructed by the optical wiring 200 and respective electric wirings of two circuit substrates 60, 60.

Embodiment 4

Figure 9:
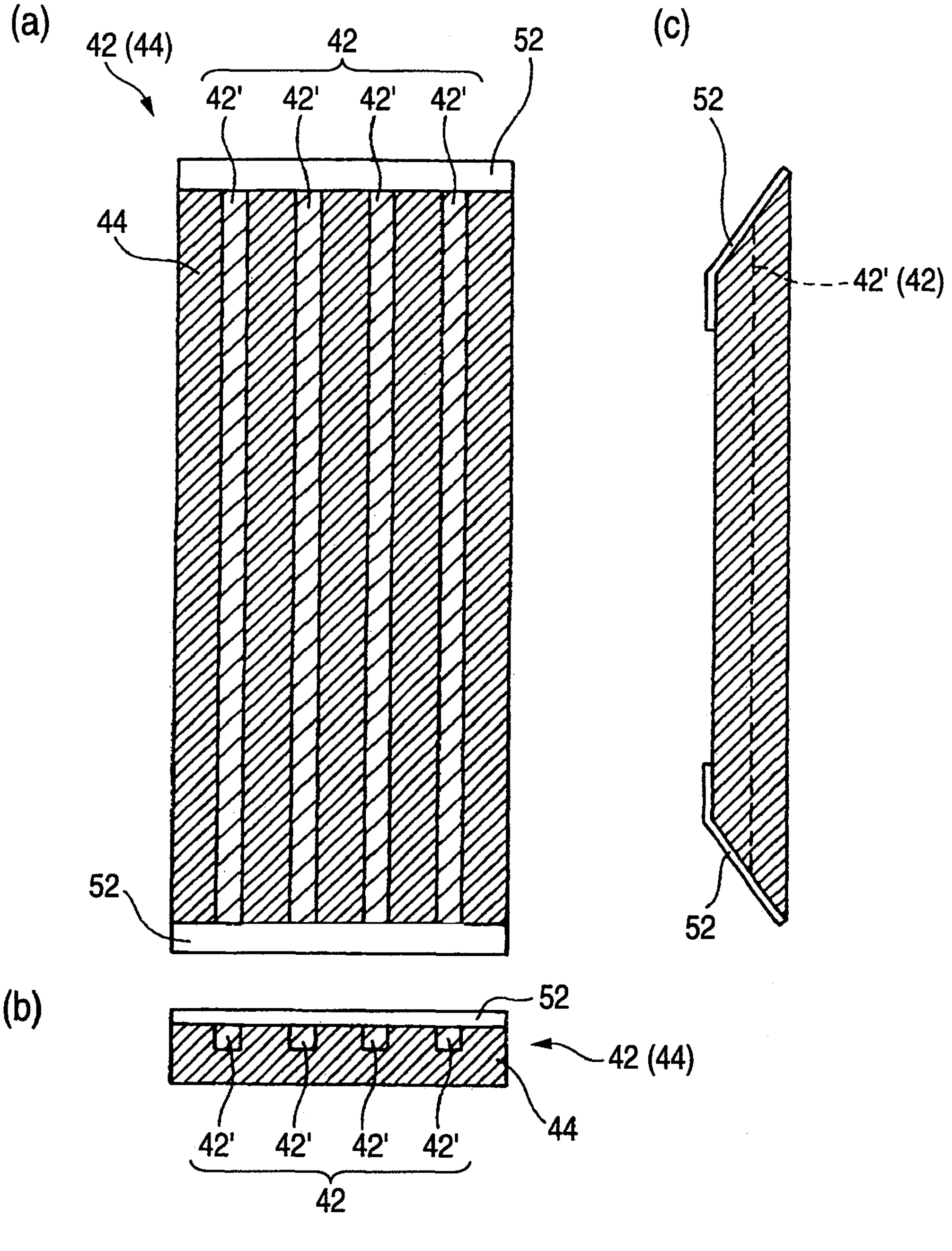
FIG. 9 shows the clad/core bonded pieces including four sub-core layers, which are obtained in the manufacturing step similar to that in FIG. 6A, where (a) is a plan view, (b) is a cross sectional view, and (c) is a side view.

FIG. 9 shows a mode in which a plurality of optical waveguides are formed collectively by using one clad/core bonded piece according to the present invention. Namely, the clad/core bonded piece 42/44 shown in FIG. 6A contains one core layer 42 in one piece. In contrast, a clad/core bonded piece 42'/44 in FIG. 9 contains four sub-core layers 42' in one piece. The respective sub-core layer 42' is put between the cladding layers 44 on both sides, and four optical waveguides each consisting of the cladding layer 44/the sub-core layer 42'/the cladding layer 44 are constructed. The same reference symbols are affixed to the portions corresponding to FIG. 6A.

Four sub-core layers 42' are obtained by patterning the core layers 42 in the above step 2 (see FIG. 2B) such that four sub-core layers 42' are formed in the area of the core sheet 42A constituting one core layer 42. Following manufacturing steps are similar to those in the case where one core layer 42 is contained per piece.

The clad/core bonded pieces 42'/44 formed as shown in FIGS. 9A to 9C are bonded to the circuit substrate 60 by the liquid adhesive 54 similarly to the above step 10 and the step 11 (see FIGS. 6B and 6C). Thus, four optical waveguides 72 are formed collectively. The sub-core layers 42' of individual optical waveguides 72 function as the individual light signal lines mutually.

According to the present invention, there is provided a method of forming the optical waveguide that can reduce takt time and cost required for forming a triple-layered structure, slimming down a circuit structure, and enhancing a versatility without the need of complicated processes.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A method of forming an optical waveguide on a circuit substrate, the method comprising:

(a) laminating a core sheet on a base plate;

(b) patterning the core sheet, thereby forming a plurality of core layers each aligned in parallel on the base plate;

(c) laminating a cladding sheet on the base plate such that the core layers are embedded in the cladding sheet except one surface of each of the core layers contacting the base plate, thereby forming a clad/core bonded body;

(d) peeling the base plate from the clad/core bonded body;

(e) pasting a dicing tape on one surface of the clad/core bonded body opposite to said one surface of each of the core layers exposed from the cladding sheet;

(f) bevel-cutting the core layers and the cladding sheet in a width direction of the core layers on both side portions of the core layers, thereby forming an inclined surface in the clad/core bonded body;

(g) straight-cutting the cladding sheet between the core layers and on an outside of outermost core layers of the core layers along a length direction of the core layers, thereby collectively forming a plurality of clad/core bonded pieces;

(h) disposing a mask on the clad/core bonded pieces such that the inclined surface of the clad/core bonded pieces is exposed from the mask;

(i) forming a metal film on the inclined surface, wherein the metal mask serves as a reflecting film;

(j) removing the mask;

(k) peeling the dicing tape from the clad/core bonded pieces, thereby separating the clad/core bonded pieces individually;

(l) coating a liquid adhesive having a composition that is able to constitute a cladding layer of the optical waveguide, on an area of the circuit substrate on which the optical waveguide is to be arranged;

(m) bringing at least one of the clad/core bonded pieces into contact with the liquid adhesive such that said one surface of the core layer exposed from the cladding sheet contacts the liquid adhesive;

(n) aligning the at least one of the clad/core bonded pieces on the area of the circuit substrate on which the optical waveguide is to be arranged; and (o) curing the liquid adhesive, thereby forming the optical waveguide on the circuit substrate, wherein the optical waveguide comprises: a lower cladding layer formed of the cured adhesive; the core layer of the clad/core bonded piece; and a upper cladding layer formed of the cladding sheet.

2. The method according to claim 1, wherein the core layer comprises a plurality of sub-core layers, and the same material as the cladding layer is filled between the sub-core layers.

* * * * *